US009245996B2

(12) United States Patent
Lin et al.

(10) Patent No.: US 9,245,996 B2
(45) Date of Patent: Jan. 26, 2016

(54) LATERAL DOUBLE-DIFFUSED METAL-OXIDE-SEMICONUDCTOR TRANSISTOR DEVICE AND LAYOUT PATTERN FOR LDMOS TRANSISTOR DEVICE

(71) Applicant: UNITED MICROELECTRONICS CORP., Hsin-Chu (TW)

(72) Inventors: An-Hung Lin, New Taipei (TW); Bo-Jui Huang, Hsinchu (TW); Kun-Yi Chou, New Taipei (TW); Hsiao-Wen Liu, New Taipei (TW); Kai-Cheng Chang, Taichung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 151 days.

(21) Appl. No.: 14/146,012

(22) Filed: Jan. 2, 2014

(65) Prior Publication Data
US 2015/0187933 A1 Jul. 2, 2015

(51) Int. Cl.
*H01L 29/78* (2006.01)
*H01L 29/06* (2006.01)
*H01L 29/08* (2006.01)

(52) U.S. Cl.
CPC ........ *H01L 29/7816* (2013.01); *H01L 29/0615* (2013.01); *H01L 29/0865* (2013.01); *H01L 29/0882* (2013.01)

(58) Field of Classification Search
CPC ...................... H01L 29/0882; H01L 29/0865
See application file for complete search history.

(56) References Cited

U.S. PATENT DOCUMENTS

| | | | | |
|---|---|---|---|---|
| 4,300,150 A | * | 11/1981 | Colak | 257/336 |
| 5,304,827 A | | 4/1994 | Malhi et al. | |
| 5,811,850 A | | 9/1998 | Smayling et al. | |
| 6,693,339 B1 | * | 2/2004 | Khemka et al. | 257/492 |
| 6,825,531 B1 | * | 11/2004 | Mallikarjunaswamy | 257/343 |
| 7,683,426 B2 | | 3/2010 | Williams et al. | |
| 7,713,825 B2 | | 5/2010 | Hu et al. | |
| 2003/0173624 A1 | * | 9/2003 | Choi et al. | 257/368 |
| 2004/0079974 A1 | | 4/2004 | Lin et al. | |
| 2004/0106236 A1 | | 6/2004 | Hu et al. | |
| 2007/0246771 A1 | * | 10/2007 | McCormack et al. | 257/335 |
| 2009/0283843 A1 | * | 11/2009 | Alter | 257/408 |
| 2012/0037986 A1 | * | 2/2012 | Kim et al. | 257/336 |
| 2012/0286359 A1 | * | 11/2012 | Lin et al. | 257/335 |

* cited by examiner

*Primary Examiner* — Lex Malsawma
(74) *Attorney, Agent, or Firm* — Winston Hsu; Scott Margo

(57) ABSTRACT

A LDMOS transistor device includes a substrate including a first insulating structure formed therein, a gate formed on the substrate and covering a portion of the first insulating structure, a drain region and a source region formed in the substrate at two respective sides of the gate, a base region encompassing the source region, and a doped layer formed under the base region. The drain region and the source region include a first conductivity type, the base region and the doped layer include a second conductivity type, and the second conductivity type is complementary to the first conductivity type. A top of the doped layer contacts a bottom of the base region. A width of the doped layer is larger than a width of the base region.

18 Claims, 5 Drawing Sheets

US 9,245,996 B2

LATERAL DOUBLE-DIFFUSED METAL-OXIDE-SEMICONUDCTOR TRANSISTOR DEVICE AND LAYOUT PATTERN FOR LDMOS TRANSISTOR DEVICE

BACKGROUND OF THE INVENTION

1. Field of the Invention

The invention relates to a metal-oxide-semiconductor (MOS) transistor device and a layout pattern for the MOS transistor device, and more particularly, to a lateral double-diffused MOS (hereinafter abbreviated as LDMOS) transistor device and a layout pattern for the LDMOS transistor device.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantages of higher operational bandwidth, higher operational efficiency, and convenience to be integrated with other integrated circuit due to its planar structure, LDMOS transistor devices are prevalently used in high operational voltage environment such as CPU power supply, power management system, AC/DC converter, and high-power or high frequency (HF) band power amplifier. The essential feature of LDMOS transistor device is a lateral-diffused drift region with low dopant concentration and large area. The drift region is used to alleviate the high voltage between the drain and the source, therefore the LDMOS transistor device can have high breakdown voltage (BVD).

It is well-known that characteristics of low ON-resistance (hereinafter abbreviated as $R_{ON}$) and high breakdown voltage are always required to the HV MOS transistor device. However, breakdown voltage and $R_{ON}$ are conflicting parameters with a trade-off relationship. Therefore, a LDMOS transistor device that is able to realize high breakdown voltage and low $R_{ON}$ is still in need.

SUMMARY OF THE INVENTION

According to the claimed invention, a LDMOS transistor device is provided. The LDMOS transistor device includes a substrate comprising a first insulating structure formed therein, a gate formed on the substrate and covering a portion of the first insulating structure, a drain region and a source region formed in the substrate at two respective sides of the gate, a base region encompassing the source region, and a doped layer formed under the base region. The drain region and the source region include a first conductivity type, the base region and the doped layer includes a second conductivity type, and the second conductivity type is complementary to the first conductivity type. A top of the doped layer contacts a bottom of the base region. More important, a width of the doped layer is larger than a width of the base region.

According to the claimed invention, a layout pattern for a LDMOS transistor device is provided. The layout pattern includes a gate, a source region and a drain region spaced apart from the source region by the gate, a base region overlapped with a portion of the gate, and a doped layer formed under the base region. The source region and the drain region include a first conductivity type, the base region and the doped layer include a second conductivity type, and the second conductivity type is complementary to the first conductivity type. More important, a width of the doped layer is larger than a width of the base region.

According to the LDMOS transistor device and the layout pattern for the LDMOS transistor device, the doped layer, which includes the conductivity type the same with the base region, is formed under the base region. More important, the width of the doped layer is larger than the width of the base region. The doped layer is formed to reduce electrical field of the LDMOS transistor device, and thus a higher BVD and a lower $R_{ON}$ are concurrently obtained.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
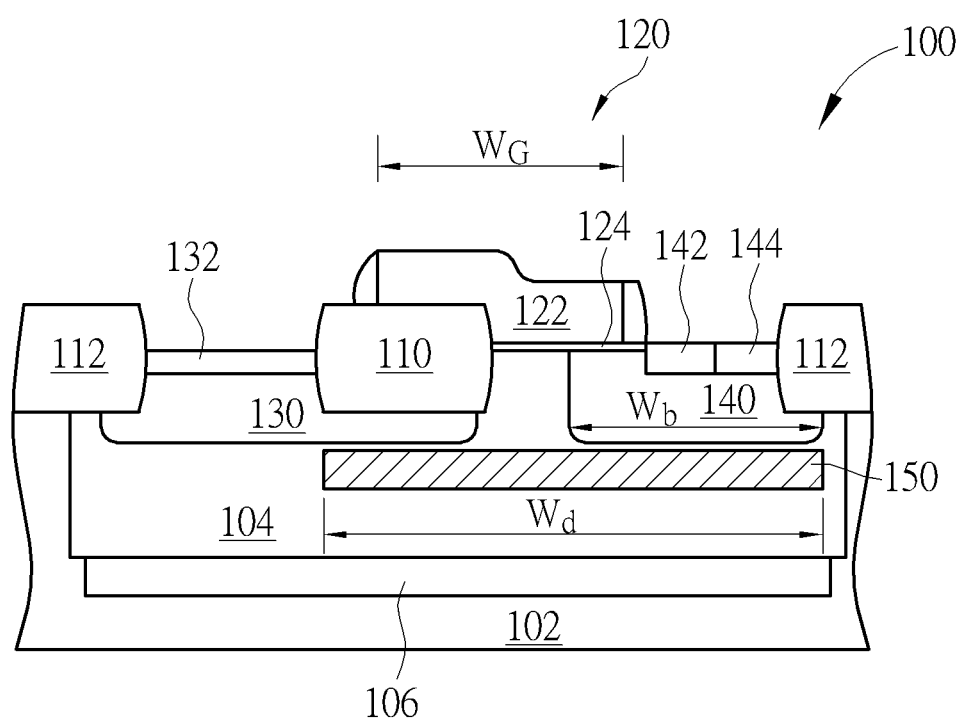
FIG. 1 is a cross-sectional view of a LDMOS transistor device provided by a first preferred embodiment of the present invention.

Please refer to FIG. 1, which is a cross-sectional view of a LDMOS transistor device provided by a first preferred embodiment of the present invention. As shown in FIG. 1, a LDMOS transistor device 100 provided by the first preferred embodiment includes a substrate 102, such as a silicon substrate. A deep well region 104 is formed in the substrate 102 and a buried doped layer 106 is formed under the deep well region 104. The deep well region 104 and the buried doped layer 106 include a first conductivity type, and the substrate 102 includes a second conductivity type. The first conductivity type and the second conductivity type are complementary to each other. In the preferred embodiment, the first conductivity type is an n type and the second conductivity type is a p-type.

Please still refer to FIG. 1. The LDMOS transistor device 100 further includes a first insulating structure 110 formed in the substrate 102, and a gate 120 positioned on the substrate 102 and covering a portion of the first insulating structure 110. Additionally, at least a pair of second insulating structures 112 are formed in the substrate 102 for electrically isolating the LDMOS transistor device 100 from other devices. The gate 120 includes a gate conductive layer 122 and a gate dielectric layer 124. As shown in FIG. 1, the LDMOS transistor device 100 includes a drift region 130 and a drain region 132 formed in the deep well region 104. Both of the drift region 130 and the drain region 132 include the first conductivity type and therefore the drift region 130 and the drain region 132 respectively are an n-drift region 130 and an n-drain region 132. Furthermore, the drain region 132 is formed in the drift region 130. In other words, the drift region 130 encompasses the drain region 132 as shown in FIG. 1. Also, the LDMOS transistor device 100 includes a base region 140, a source region 142, and a doped region 144 formed in the deep well region 104. The base region 140 and the doped region 144 include the second conductivity type while the source region 142 includes the first conductivity type. Therefore the LDMOS transistor device 100 includes a p-base region 140, a p-doped region 144 and an n-source region 142. Furthermore, the doped region 144 abuts against the source region 142 while both of the doped region 144 and the source region 142 are formed in the base region 140. It should be well known to the those skilled in the art that a channel region is to be formed in the p-base region 140 during operation.

Please still refer to FIG. 1. The LDMOS transistor device 100 provided by the first preferred embodiment includes a doped layer 150 formed in the substrate 102, specifically formed in the deep well region 104. It is noteworthy that an energy for forming the doped layer 150 is greater than an energy for forming the base region 140. For example but not limited to, the energy for forming the base region 140 is between 50 KeV and 180 KeV while the energy for forming the doped layer 150 is between 300 KeV and 500 KeV. Furthermore, a dosage for forming the doped layer 150 is lower than a dosage for forming the base region 140. For example but not limited, the dosage for forming the base region 140 is between $4.4*10^{12}$ cm$^{-2}$ and $2.5*10^{13}$ cm$^{-2}$ while the dosage for forming the doped layer 150 is about $4.5*10^{12}$ cm$^{-2}$. Additionally, since the profile and depth of the doped layer 150 are different from that of the base region 140, different masks for respectively forming the base region 140 and the doped layer 150 are required. As shown in FIG. 1, a top of the doped layer 150 contacts a bottom of the base region 140. More important, a width $W_d$ of the doped layer 150 is larger than a width $W_b$ of the base region 140. For example, an overlapping ratio between the base region 140 and the gate 120 is smaller than 30% of a width $W_G$ of the gate 120 but an overlapping ratio between the doped layer 150 and the gate 120 is larger than 30% of the width $W_G$ of the gate 120. Furthermore, the width $W_d$ of the doped layer 150 can be smaller than a distance between the pair of the second insulating structures 112, which provide electric isolation for the LDMOS transistor device 100, as shown in FIG. 1.

According to the first preferred embodiment, an asymmetric LDMOS transistor device 100 is provided. More important, the doped layer 150 deeper and wider, but lighter than the base region 140 is formed under the base region 140. The doped layer 150 efficaciously reduces the electrical field of the LDMOS transistor device 100, and thus a higher BVD and a reduced $R_{ON}$ are concurrently obtained. Specifically speaking, a ratio of the $R_{On}$ over the BVD that is the R/B ratio is lowered from 0.68 to 0.44.

Figure 2:
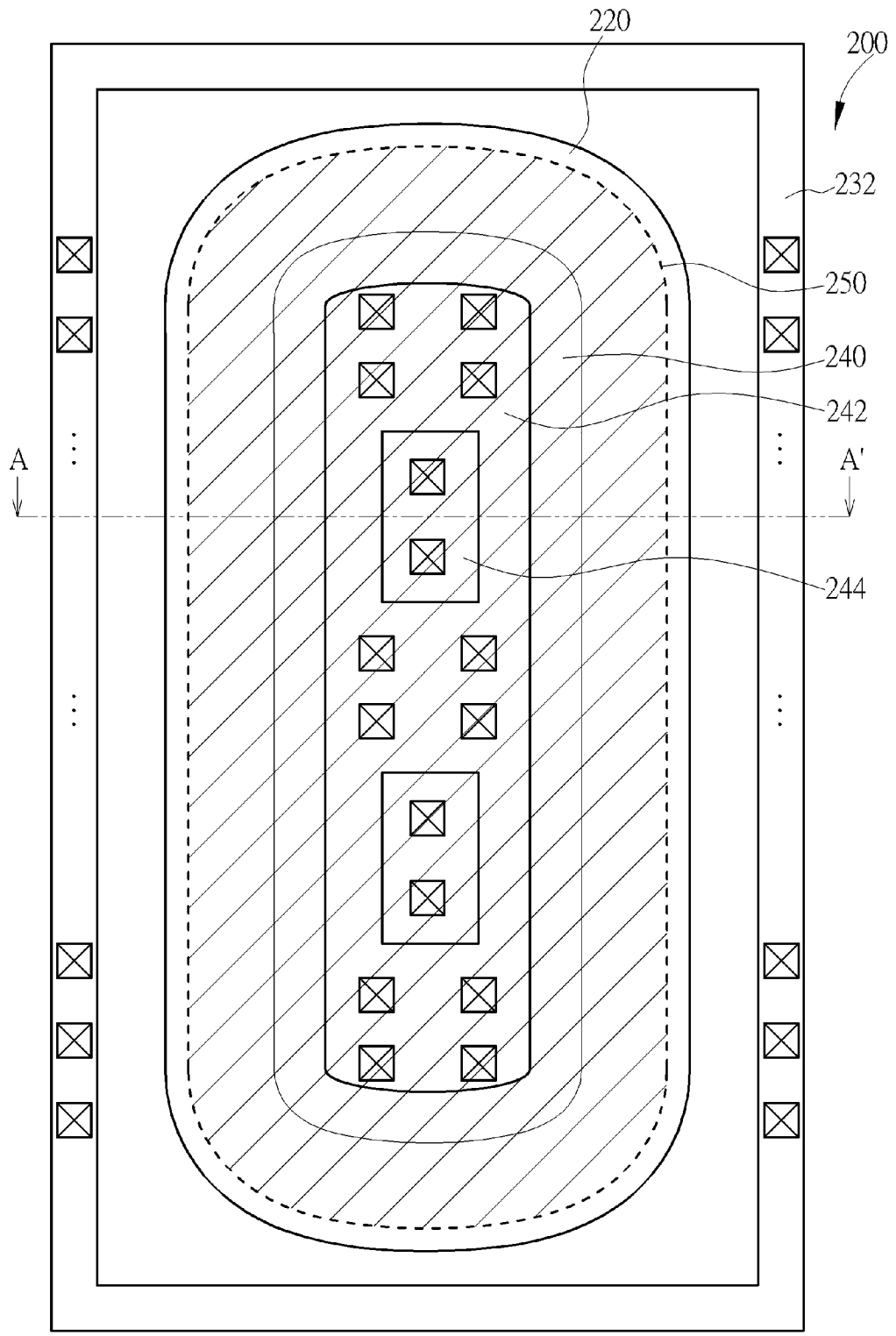
FIG. 2 is a schematic drawing of a layout pattern of a LDMOS transistor device provided by a second preferred embodiment of the present invention.
Figure 3:
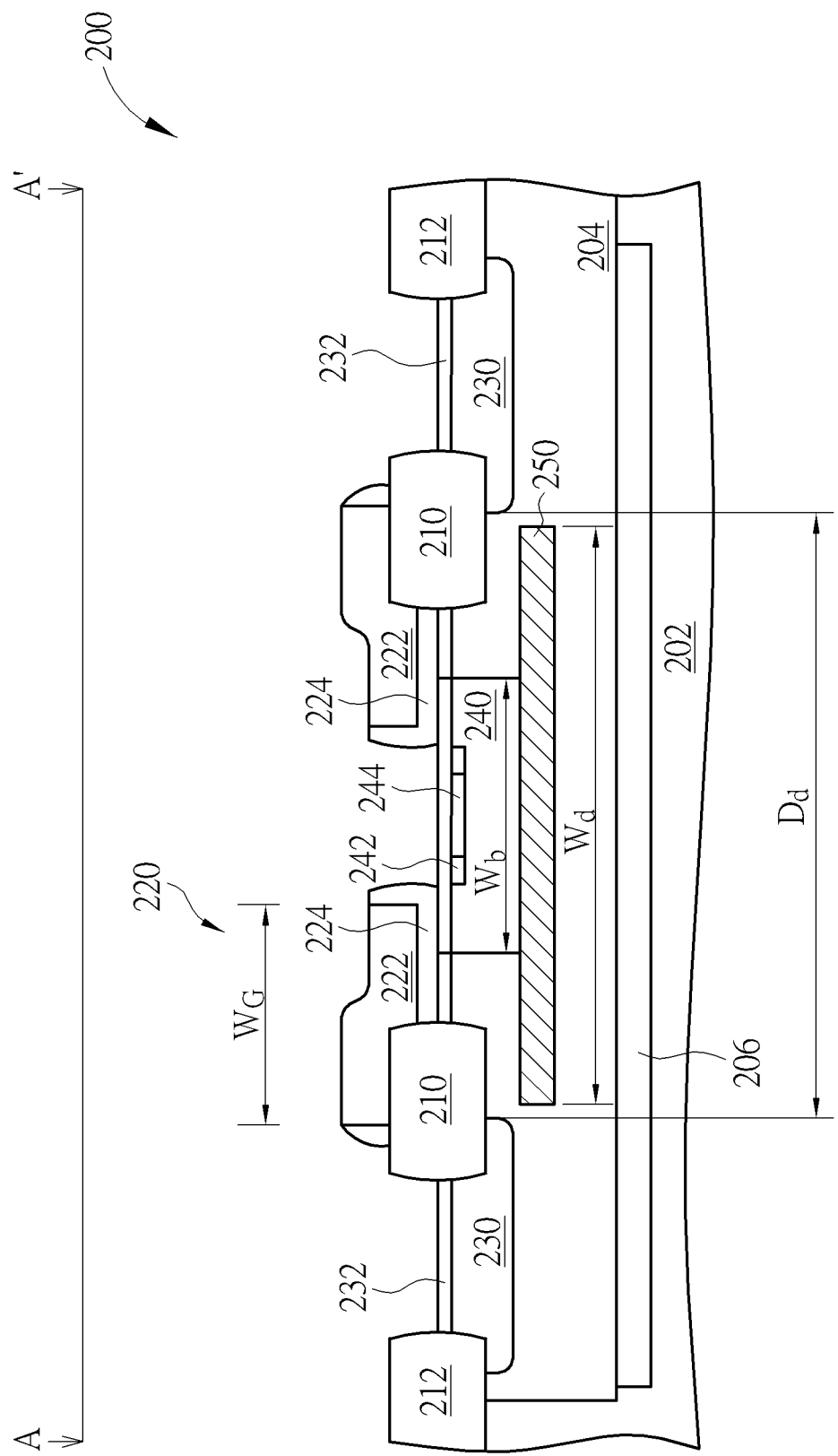
FIG. 3 is a cross-sectional view of the LDMOS transistor device taken along Line A-A' of FIG. 2.

Please refer to FIGS. 2-3, wherein FIG. 2 is a schematic drawing of a layout pattern of a LDMOS transistor device provided by a second preferred embodiment of the present invention and FIG. 3 is a cross-sectional view of the LDMOS transistor device taken along Line A-A' of FIG. 2. Moreover, in order to clearly describe the structure of the second preferred embodiment, FIGS. 2-3 should be referred together.

Please refer to FIGS. 2-3, a LDMOS transistor device 200 provided by the second preferred embodiment includes a substrate 202, such as a silicon substrate. A deep well region 204 is formed in the substrate 202 and a buried doped layer 206 is formed under the deep well region 204. The deep well region 204 and the buried doped layer 206 include a first conductivity type, and the substrate 202 includes a second conductivity type. Also, the first conductivity type and the second conductivity type are complementary to each other. In the preferred embodiment, the first conductivity type is an n type and the second conductivity type is a p-type.

The LDMOS transistor device 200 further includes a first insulating structure 210 formed in the substrate 202, and a gate 220 positioned on the substrate 202 and covering a portion of the first insulating structure 210. Additionally, a second insulating structure 212 surrounding the LDMOS transistor device 200 is formed in the substrate 202 for electrically isolating the LDMOS transistor device 200 from other devices. It should be understood that for clarifying spatial relationships between the gate 220 and other doped areas, the first and second insulating structures 210/212 are all omitted from FIG. 2. However, those skilled in the art would easily realize the placement of the first and second insulating structures 210/212 according to FIG. 3. The gate 220 includes a gate conductive layer 222 and a gate dielectric layer 224. More important, the gate 220 includes a racetrack-shaped gate as shown in FIG. 2.

Please refer to FIGS. 2-3 again. The LDMOS transistor device 200 includes a drift region 230 and a drain region 232 formed in the deep well region 204. Both of the drift region 230 and the drain region 232 include the first conductivity type. Furthermore, the drain region 232 is formed in the drift region 230. In other words, the drift region 230 encompasses the drain region 232 as shown in FIG. 3. Also, the LDMOS transistor device 200 includes abase region 240, a source region 242, and a plurality of doped regions 244 formed in the deep well region 204. The base region 240 and the doped regions 244 include the second conductivity type while the source region 242 includes the first conductivity type. The doped regions 244 are formed in the source region 242 and the source region 242 is formed in the base region 240. It should be noted that the base region 240 are encompassed within the racetrack-shaped gate 220 and overlapped with a portion of the racetrack-shaped gate 220 for forming channel region during operation. More important, the source region 242 is encompassed within the racetrack-shaped gate 220 while the drain region 232 includes a ring-shaped drain region formed at an outer side of the racetrack-shaped gate 220 as shown in FIG. 2.

Please still refer to FIGS. 2-3. The LDMOS transistor device 200 provided by the second preferred embodiment includes a doped layer 250 formed in the substrate 202, specifically formed in the deep well region 204. It is noteworthy that an energy for forming the doped layer 250 is greater than an energy for forming the base region 240, and a dosage for forming the doped layer 250 is lower than a dosage for forming the base region 240. Since the energies and dosages for forming the base region 240 and the doped layer 250 are the same with those described in the first preferred embodiment, those details are omitted herein in the interest of brevity. Additionally, since the profile and depth of the doped layer 250 are different from that of the base region 240, different masks for respectively forming the base region 240 and the doped layer 250 are required. As shown in FIG. 3, a top of the doped layer 250 contacts a bottom of the base region 240. More important, a width $W_d$ of the doped layer 250 is larger than a width $W_b$ of the base region 240. For example, an overlapping ratio between the base region 240 and the gate 220 is smaller than 30% of a width $W_G$ of the gate 220 but an overlapping ratio between the doped layer 250 and the gate 220 is larger than 30% of the width $W_G$ of the gate 220. Furthermore, the width $W_d$ of the doped layer 250 can be smaller than a distance $D_d$ between the drain region 232 at two outer sides of the racetrack-shaped gate 220 in accordance with the preferred embodiment.

According to the second preferred embodiment, a symmetric LDMOS transistor device 200 is provided. More important, the doped layer 250 deeper and wider, but lighter than the base region 240 is formed under the base region 240. The doped layer 250 efficaciously reduces the electrical field of the LDMOS transistor device 200, and thus a higher BVD and a reduced $R_{ON}$ are concurrently obtained. Specifically speaking, a ratio of the $R_{On}$ over the BVD that is the R/B ratio is lowered from 0.68 to 0.44.

Figure 4:
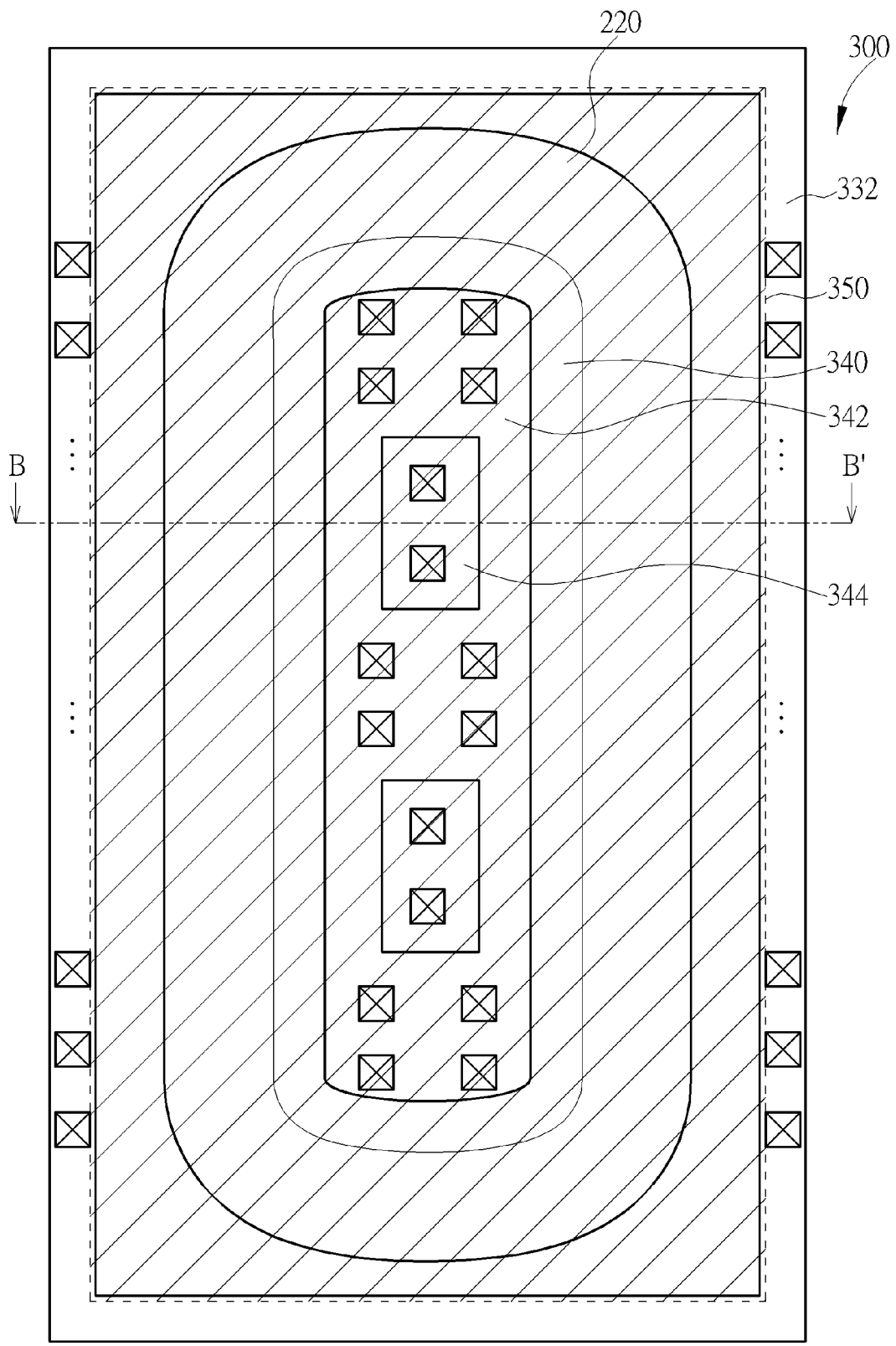
FIG. 4 is a schematic drawing of a layout pattern of a LDMOS transistor device provided by a third preferred embodiment of the present invention.
Figure 5:
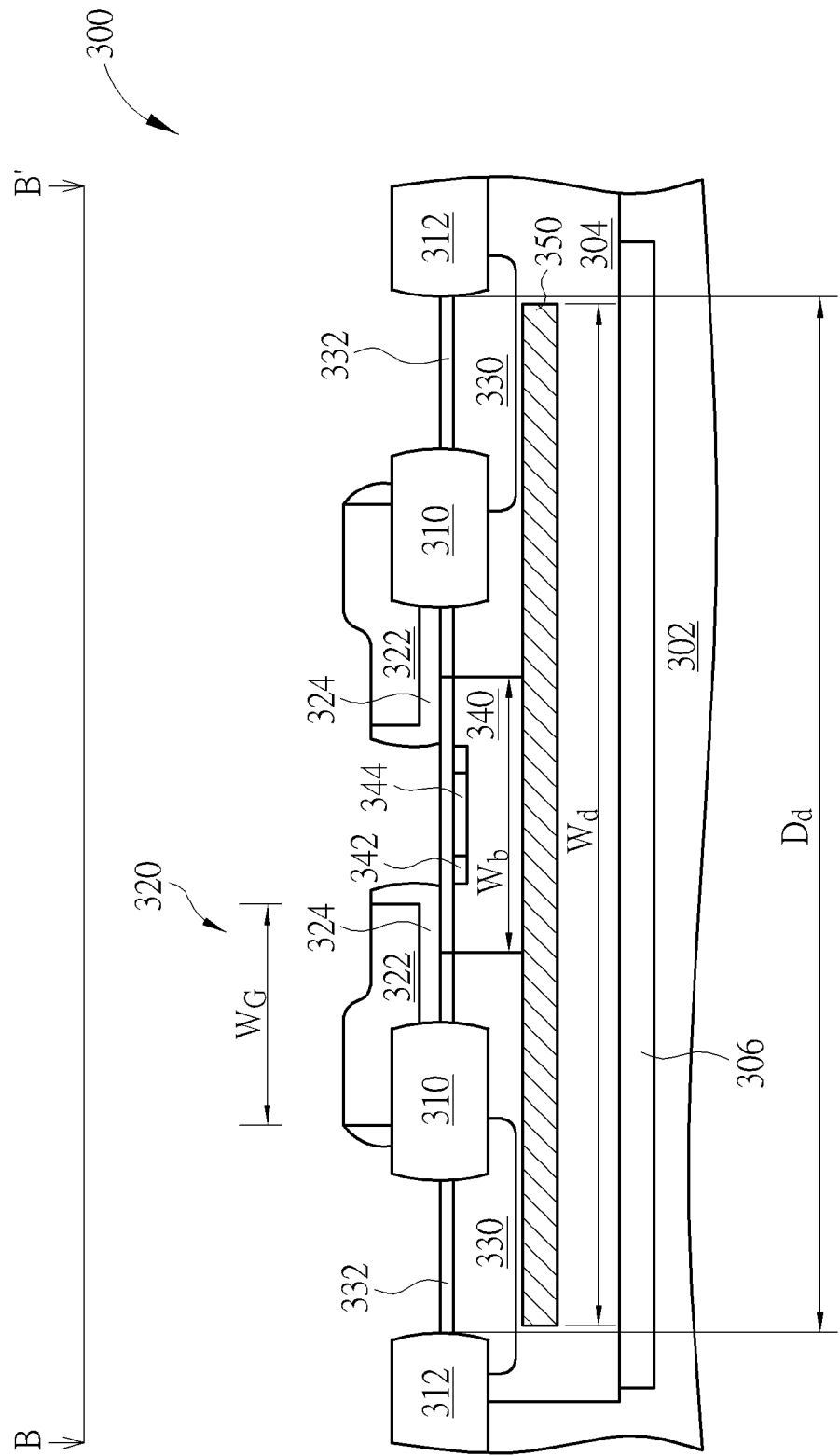
FIG. 5 is a cross-sectional view of the LDMOS transistor device taken along Line B-B' of FIG. 4.

Please refer to FIGS. 4-5, wherein FIG. 4 is a schematic drawing of a layout pattern of a LDMOS transistor device provided by a third preferred embodiment of the present invention and FIG. 5 is a cross-sectional view of the LDMOS transistor device taken along Line B-B' of FIG. 4. In order to clearly describe the structure of the third preferred embodiment, FIGS. 4-5 should be referred together. A LDMOS transistor device 300 provided by the second preferred embodiment includes a substrate 302, such as a silicon substrate. A deep well region 304 is formed in the substrate 302 and a buried doped layer 306 is formed under the deep well region 304. The deep well region 304 and the buried doped layer 306 include a first conductivity type, and the substrate 302 includes a second conductivity type. The first conductivity type and the second conductivity type are complementary to each other. In the preferred embodiment, the first conductivity type is an n type and the second conductivity type is a p-type.

The LDMOS transistor device 300 further includes a first insulating structure 310 formed in the substrate 302, and a gate 320 positioned on the substrate 302 and covering a portion of the first insulating structure 310. Additionally, a second insulating structure 312 surrounding the LDMOS transistor device 300 is formed in the substrate 302 for electrically isolating the LDMOS transistor device 300 from other devices. It should be understood that for clarifying spatial relationships between the gate 320 and other doped areas, the first and second insulating structures 310/312 are all omitted from FIG. 4. However, those skilled in the art would easily realize the placement of the first and second insulating structures 310/312 according to FIG. 5. The gate 320 includes a gate conductive layer 322 and a gate dielectric layer 324. More important, the gate 320 includes a racetrack-shaped gate as shown in FIG. 4.

Please refer to FIGS. 4-5 again. The LDMOS transistor device 300 includes a drift region 330 and a drain region 332 formed in the deep well region 304. Both of the drift region 330 and the drain region 332 include the first conductivity type. Furthermore, the drain region 332 is formed in the drift region 330. In other words, the drift region 330 encompasses the drain region 332 as shown in FIG. 5. Also, the LDMOS transistor device 300 includes abase region 340, a source region 342, and a plurality of doped regions 344 formed in the deep well region 304. The base region 340 and the doped regions 344 include the second conductivity type while the source region 342 includes the first conductivity type. The doped regions 344 are formed in the source region 342 and the source region 342 is formed in the base region 340. It should be noted that the base region 340 are encompassed within the racetrack-shaped gate 320 and overlapped with a portion of the racetrack-shaped gate 320 for forming channel region during operation. More important, the source region 342 is encompassed within the racetrack-shaped gate 320 while the drain region 332 includes a ring-shaped drain region formed at an outer side of the racetrack-shaped gate 320 as shown in FIG. 5.

Please still refer to FIGS. 4-5. The LDMOS transistor device 300 provided by the second preferred embodiment includes a doped layer 350 formed in the substrate 302, specifically formed in the deep well region 304. It is noteworthy that an energy for forming the doped layer 350 is greater than an energy for forming the base region 340, and a dosage for forming the doped layer 350 is lower than a dosage for forming the base region 340. Since the energies and dosages for forming the base region 340 and the doped layer 350 are the same with those described in the first preferred embodiment, those details are omitted herein in the interest of brevity. Additionally, since the profile and depth of the doped layer 350 are different from that of the base region 340, different masks are required for respectively forming the base region 340 and the doped layer 350. As shown in FIG. 5, a top of the doped layer 350 contacts a bottom of the base region 340. More important, a width $W_d$ of the doped layer 350 is larger than a width $W_b$ of the base layer 340. For example, an overlapping ratio between the base region 340 and the gate 320 is smaller than 30% of a width $W_G$ of the gate 320 but an overlapping ratio between the doped layer 350 and the gate 320 is larger than 30% of the width $W_G$ of the gate 320. Furthermore, the width $W_d$ of the doped layer 350 can be smaller than a distance $D_s$ between the second insulating structure 312 at two outer sides of the LDMOS transistor device 300.

According to the third preferred embodiment, a symmetric LDMOS transistor device 300 is provided. More important, the doped layer 350 deeper and wider, but lighter than the base region 340 is formed under the base region 340. The doped layer 350 efficaciously reduces the electrical field of the LDMOS transistor device 300, and thus a higher BVD and a reduced $R_{ON}$ are concurrently obtained. Specifically speaking, a ratio of the $R_{On}$ over the BVD that is the R/B ratio is lowered from 0.68 to 0.44.

According to the LDMOS transistor device and the layout pattern for the LDMOS transistor device, the doped layer, which includes the conductivity type the same with the base region, is formed under the base region. More important, the width of the doped layer is larger than the width of the base region. The width of the doped layer is adjustable according to different requirements: the width of the doped layer can be smaller than the distance between the drain at two outer sides of the racetrack-shaped gate in the symmetric LDMOS approach, or smaller than the distance between the second insulating structure(s) which serves to electrically isolate the LDMOS transistor device from other devices in the asymmetric and/or symmetric LDMOS approach. Additionally, the LDMOS transistor device can be easily integrated in the symmetric and the asymmetric LDMOS approach in accordance with the present invention. Consequently, electrical field of the LDMOS transistor device is reduced, and thus a higher BVD and a lower $R_{ON}$ are obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lateral double-diffused metal-oxide-semiconductor (LDMOS) transistor device comprising:
    a substrate comprising a first insulating structure formed therein;
    a gate formed on the substrate and covering a portion of the first insulating structure;
    a drain region and a source region formed in the substrate at two respective sides of the gate, the drain region and the source region comprising a first conductivity type;
    a base region encompassing the source region, the base region comprising a second conductivity type complementary to the first conductivity type;

a drift region encompassing the drain region, the drift region comprising the first conductivity type and being spaced apart from the base region; and a doped layer formed under the base region, the doped layer comprising the second conductivity type, wherein a top of the doped layer contacts a bottom of the base region, and a width of the doped layer is larger than a width of the base region.

2. The LDMOS transistor device according to claim 1, wherein the first conductivity type is an n type and the second conductivity type is a p type.

3. The LDMOS transistor device according to claim 1, further comprising a doped region abutting the source region, and the doped region comprising the second conductivity type.

4. The LDMOS transistor device according to claim 1, further comprising a deep well region comprising the first conductivity type.

5. The LDMOS transistor device according to claim 4, wherein the source region, the base region, the doped layer, the drain region, and the drift region are all formed in the deep well region.

6. The LDMOS transistor device according to claim 4, further comprising a buried doped layer formed under the deep well region, the buried doped layer comprising the first conductivity type.

7. The LDMOS transistor device according to claim 1, wherein an energy for forming the doped layer is greater than an energy for forming the base region.

8. The LDMOS transistor device according to claim 1, wherein a dosage for forming the doped layer is lower than a dosage for forming the base region.

9. The LDMOS transistor device according to claim 1, further comprising at least a pair of second insulating structures formed in the substrate, the pair of the second insulating structures electrically isolate the LDMOS transistor device.

10. The LDMOS transistor device according to claim 9, wherein the width of the doped layer is smaller than a distance between the pair of the second insulating structures.

11. A layout pattern for a lateral double-diffused metal-oxide-semiconductor (LDMOS) transistor device comprising:

a racetrack-shaped gate;

a source region comprising a first conductivity type;

a ring-shaped drain region spaced apart from the source region by the racetrack-shaped gate, the ring-shaped drain region comprising the first conductivity type, the ring-shaped drain region being formed at an outer side of the racetrack-shaped gate;

a base region overlapped with a portion of the racetrack-shaped gate, the base region comprising a second conductivity type complementary to the first conductivity type; and a doped layer formed under the base region, the doped layer comprising the second conductivity type, wherein a width of the doped layer is larger than a width of the base region and smaller than a distance between the ring-shaped drain region at the outer side of the racetrack-shaped gate.

12. The layout pattern for the LDMOS transistor device according to claim 11, wherein the first conductivity type is an n type and the second conductivity type is a p type.

13. The layout pattern for the LDMOS transistor device according to claim 11, wherein the source region is encompassed within the racetrack-shaped gate.

14. The layout pattern for the LDMOS transistor device according to claim 11, further comprising an insulating structure surrounding the LDMOS transistor device.

15. The layout pattern for the LDMOS transistor device according to claim 14, wherein the width of the doped layer is smaller than a distance between the insulating structure at two sides of the LDMOS transistor device.

16. The layout pattern for the LDMOS transistor device according to claim 11, further comprising a plurality of doped regions formed in the source region, the doped regions comprise the second conductivity type.

17. The layout pattern for the LDMOS transistor device according to claim 11, wherein an energy for forming the doped layer is greater than an energy for forming the base region.

18. The layout pattern for the LDMOS transistor device according to claim 11, wherein a dosage for forming the doped layer is lower than a dosage for forming the base region.

* * * * *